United States Patent
Jung et al.

(10) Patent No.: US 11,201,317 B2
(45) Date of Patent: Dec. 14, 2021

(54) METHOD OF PEELING MOTHER PROTECTIVE FILM AND METHOD OF MANUFACTURING ORGANIC LIGHT-EMITTING DISPLAY APPARATUS USING THE SAME

(71) Applicant: Samsung Display Co., Ltd., Yongin-si (KR)

(72) Inventors: Jiwon Jung, Yongin-si (KR); Youngji Kim, Yongin-si (KR); Yiseul Um, Yongin-si (KR); Younghoon Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 104 days.

(21) Appl. No.: 16/589,178

(22) Filed: Oct. 1, 2019

(65) Prior Publication Data
US 2020/0168848 A1    May 28, 2020

(30) Foreign Application Priority Data
Nov. 22, 2018    (KR) .................... 10-2018-0145651

(51) Int. Cl.
*H01L 51/56*    (2006.01)
*H01L 27/32*    (2006.01)
*H01L 51/52*    (2006.01)

(52) U.S. Cl.
CPC .......... *H01L 51/56* (2013.01); *H01L 27/323* (2013.01); *H01L 51/5253* (2013.01)

(58) Field of Classification Search
CPC ... H01L 51/56; H01L 27/323; H01L 51/5253; H01L 2251/566; H01L 27/3244;
(Continued)

(56) References Cited

U.S. PATENT DOCUMENTS 8,841,150 B2 *    9/2014    Kim ................... H01L 27/15
                                                            438/33
9,574,111 B2      2/2017    Niimi et al.
(Continued)

FOREIGN PATENT DOCUMENTS

DE    10 2016 108195    11/2017
JP         5739506       6/2015
(Continued)

OTHER PUBLICATIONS

Extended European Search Report dated Apr. 21, 2020, issued to European Patent Application No. 19210914.8.

*Primary Examiner* — Kyoung Lee
(74) *Attorney, Agent, or Firm* — H.C. Park & Associates, PLC

(57) ABSTRACT

A method of peeling a mother protective film from a mother display panel includes: laminating the mother protective film on the mother display panel, the mother display panel comprising a plurality of display cells each including a display area and a peripheral area in an outer portion of the display cells; forming a target area and a dummy area on the mother protective film by forming a cutting line having a closed loop shape enclosing the target area corresponding to the display cells and an additional cutting line in a first direction near the cutting line; arranging a fixing member on the mother protective film within the target area enclosed by the cutting line; and physically peeling off the dummy area from the mother display panel.

29 Claims, 17 Drawing Sheets

(58) Field of Classification Search
CPC ................. H01L 21/6836; H01L 21/78; H01L 2221/68327; H01L 2221/68386
See application file for complete search history.

(56) References Cited

U.S. PATENT DOCUMENTS

| | | |
|---|---|---|
| 9,755,192 B2 | 9/2017 | You et al. |
| 2002/0134485 A1 | 9/2002 | Habeck et al. |
| 2015/0053952 A1 | 2/2015 | Okumura et al. |
| 2017/0084879 A1 | 3/2017 | Wen et al. |
| 2017/0084883 A1 | 3/2017 | Kwon et al. |
| 2017/0153732 A1 | 6/2017 | Choi et al. |
| 2017/0183251 A1 | 6/2017 | Forenz et al. |
| 2017/0194579 A1 | 7/2017 | Wang |
| 2018/0012787 A1 | 1/2018 | Oka et al. |

FOREIGN PATENT DOCUMENTS

| | | |
|---|---|---|
| KR | 10-2014-0045837 | 4/2014 |
| KR | 10-1734439 | 5/2017 |
| KR | 10-2017-0062598 | 6/2017 |

* cited by examiner

<PRIOR ART>

<PRIOR ART>

<PRIOR ART>

<PRIOR ART>

<PRIOR ART>

<PRIOR ART>

<PRIOR ART>

METHOD OF PEELING MOTHER PROTECTIVE FILM AND METHOD OF MANUFACTURING ORGANIC LIGHT-EMITTING DISPLAY APPARATUS USING THE SAME

CROSS-REFERENCE TO RELATED APPLICATION

This application claims priority from and the benefit of Korean Patent Application No. 10-2018-0145651, filed on Nov. 22, 2018, which is hereby incorporated by reference for all purposes as if fully set forth herein.

BACKGROUND

Field

Exemplary embodiments of the invention relate generally to a method of peeling a mother protective film and a method of manufacturing an organic light-emitting display apparatus using the same, whereby the process efficiency may be increased and the costs may be reduced.

Discussion of the Background

An organic light-emitting display apparatus includes a substrate, an organic light-emitting device on the substrate, and an encapsulation member encapsulating the organic light-emitting device. Unlike when using an encapsulation member formed of glass, when an encapsulation member having a thin film structure including an organic layer and an inorganic layer is used, a protective film may be arranged temporarily or permanently on an encapsulation member to protect the encapsulation member, which is thin, and the organic light-emitting device from external impurities.

An organic light-emitting display apparatus is manufactured by simultaneously manufacturing a plurality of display cells on a mother substrate and then scribing the mother substrate to separate the plurality of display cells and performing a subsequent process such as a module attaching operation on each of the display cells. The scribing process is performed by forming a cutting line in a peripheral area outside a display area of the display cells. When a glass lower substrate is combined with a glass upper substrate, scribing is performed using a wheel. When a flexible lower substrate is combined with a thin-film encapsulation member, scribing may be performed using a laser. However, when a protective film is attached on a combination of a glass lower substrate and a thin-film encapsulation member, it is difficult to perform a scribing operation.

The above information disclosed in this Background section is only for understanding of the background of the inventive concepts, and, therefore, it may contain information that does not constitute prior art.

SUMMARY

Methods according to exemplary implementations of the invention include a method of peeling a mother protective film and a method of manufacturing an organic light-emitting display apparatus having increased process efficiency and reduced costs.

Additional features of the inventive concepts will be set forth in the description which follows, and in part will be apparent from the description, or may be learned by practice of the inventive concepts.

According to one or more embodiments of the invention, a method of peeling a mother protective film from a mother display panel includes: laminating the mother protective film on the mother display panel, the mother display panel comprising a plurality of display cells each including a display area and a peripheral area in an outer portion of the display cells; forming a target area and a dummy area on the mother protective film by forming a cutting line having a closed loop shape enclosing the target area corresponding to the display cells and an additional cutting line in a first direction near the cutting line; arranging a fixing member on the mother protective film within the target area enclosed by the cutting line; and physically peeling off the dummy area from the mother display panel.

A depth of the cutting line and the additional cutting line may be less than a thickness of the mother protective film.

The cutting line and the additional cutting line may be formed using a laser beam.

The laser beam may include a $CO_2$ laser.

The cutting line and the additional cutting line may be formed using a knife.

The cutting line and the additional cutting line may be formed using an ultrasound cutter including a vibrator and a blade.

The fixing member may include a fixing plate and a supporting portion vertically connected to the fixing plate.

A buffer member may be further arranged between the fixing plate and the mother protective film.

The fixing member may include a magnetic material.

The arranging the fixing member may include arranging a table having magnetic properties on a lower surface of the mother display panel.

The fixing member may be arranged in a point shape within the target area.

The fixing member may be arranged in a closed loop shape within the target area.

The physically peeling off of the dummy area may include applying an external force along the additional cutting line in the first direction.

The additional cutting line may be connected to the cutting line.

At least an end of the additional cutting line may be formed within the cutting line.

The additional cutting line may be spaced apart from the cutting line.

The target area having a closed loop shape may have a smaller area than the display cell.

The mother protective film may include an adhesive layer attached to the mother display panel and a base substrate arranged on the adhesive layer.

The method of peeling a mother protective film may further include: before the physical peeling off of the dummy area and after the arranging of the fixing member, irradiating the dummy area with ultra violet (UV) light to reduce an adhesive force of a portion of the adhesive layer corresponding to the dummy area.

The method of peeling a mother protective film may further include: after the physical peeling off of the dummy area: removing the fixing member from the target area; and irradiating the target area with UV light to increase an adhesive force of a portion of the adhesive layer corresponding to the target area.

The irradiating of the target area may include: arranging a mask having an opening corresponding to the target area on the mother protective film; and irradiating the target area with the UV light.

According to one or more embodiments of the invention, a method of manufacturing an organic light-emitting display apparatus includes: forming a mother display panel on a mother substrate, the mother display panel including: display cells including: a plurality of organic light-emitting devices; and an encapsulation member encapsulating the plurality of organic light-emitting devices; and a peripheral area arranged on an outer portion of the display cells; laminating a mother protective film on the mother display panel; forming a target area and a dummy area on the mother protective film by forming a cutting line having a closed loop shape enclosing the target area corresponding to the display cell and an additional cutting line in a first direction near the cutting line; arranging a fixing member on the mother protective film within the target area enclosed by the cutting line; physically peeling off the dummy area from the mother display panel; removing the fixing member, and then separating the mother display panel into a plurality of display cells by scribing the mother display panel;

and processing edges of the plurality of display cells.

The mother substrate may be scribed using a wheel cutting device.

The mother substrate may be scribed by applying a force to the wheel cutting device in a direction from the mother protective film to the mother substrate.

The processing of edges of the display cell may include rounding at least one corner portion of the display cell.

The processing of edges of the display cell may include polishing the edges of the display cell.

The encapsulation member may include at least one organic layer and at least one inorganic layer.

The method may further include, before laminating the mother protective film, forming a touch layer on the encapsulation member.

The mother protective film may further include a polarization function.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
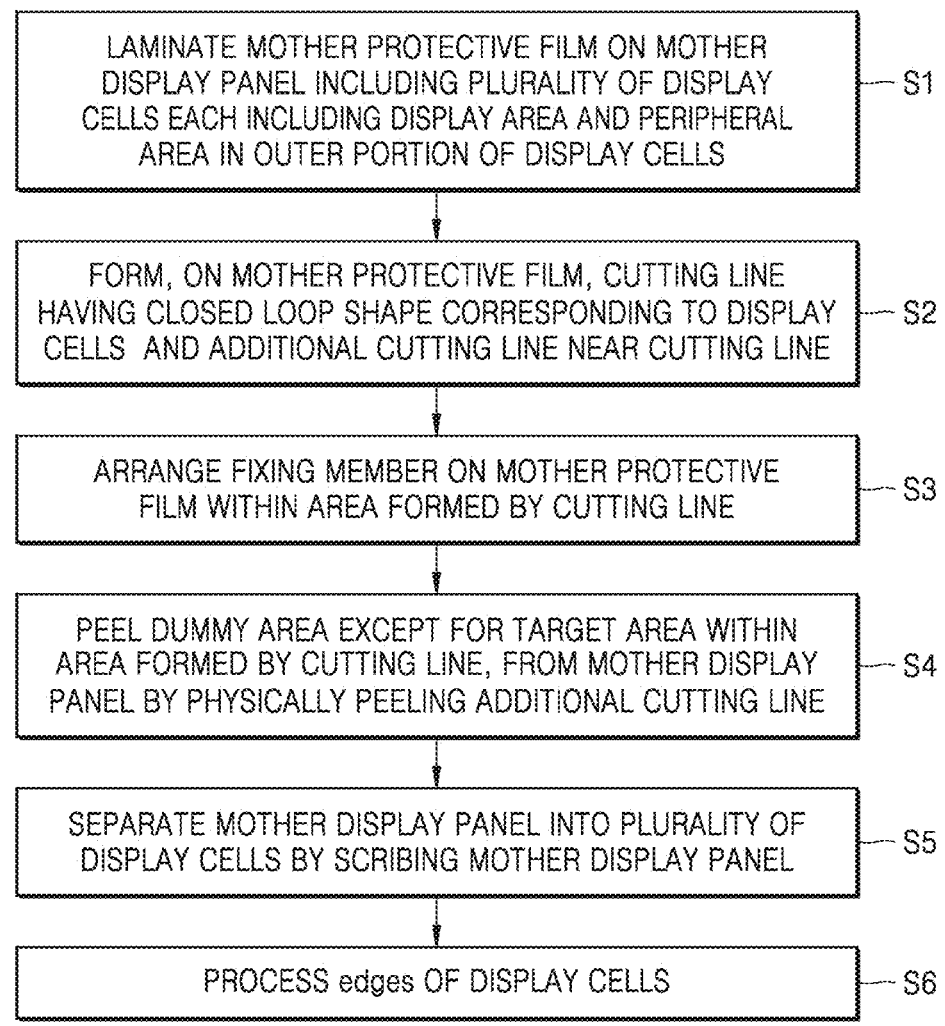
FIG. 1 is a flowchart of a method of manufacturing an organic light-emitting display apparatus, according to a first exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, an X-axis, a Y-axis, and a Z-axis are not limited to three axes of a rectangular coordinate system, such as the x, y, and z-axes, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2A:
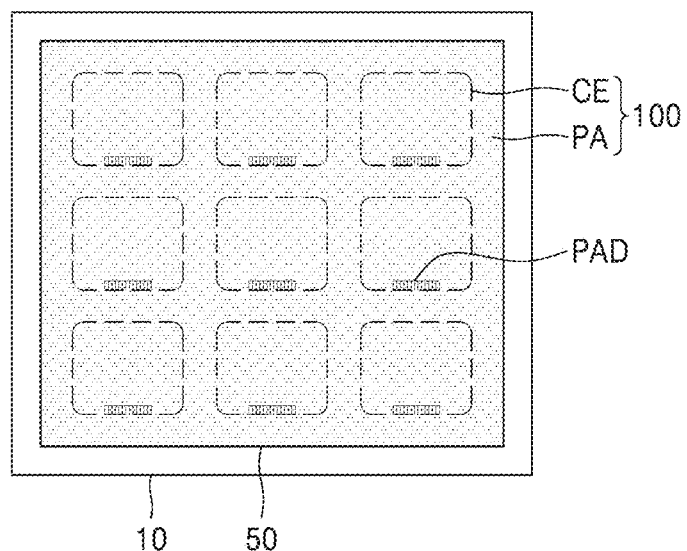
FIGS. 2A, 2B, 2C, 2D, 2E, and 2F are plan views illustrating a method of manufacturing an organic light-emitting display apparatus according to the first exemplary embodiment.
Figure 2B:
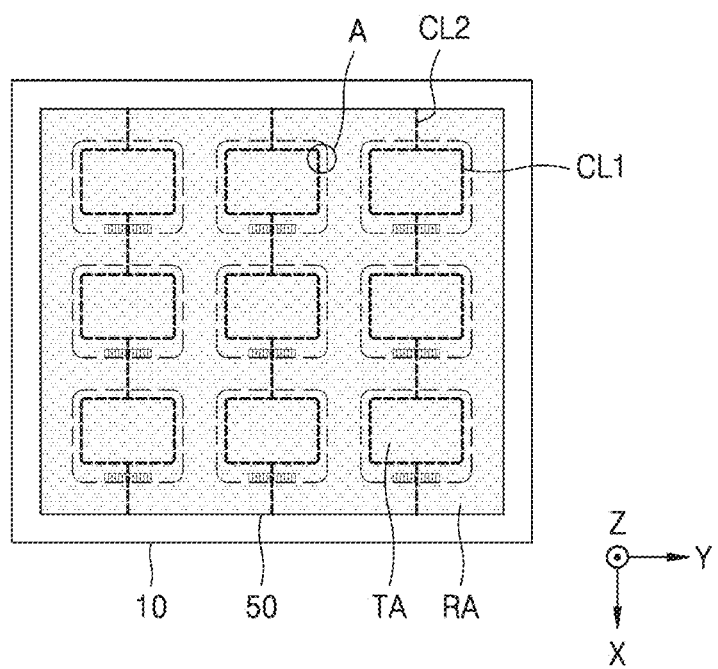
Figure 2C:
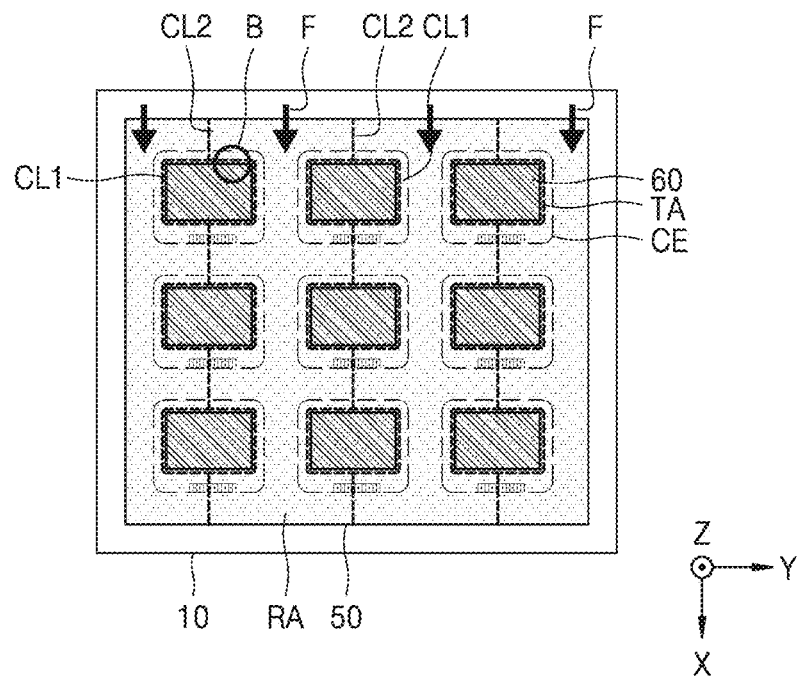
Figure 2D:
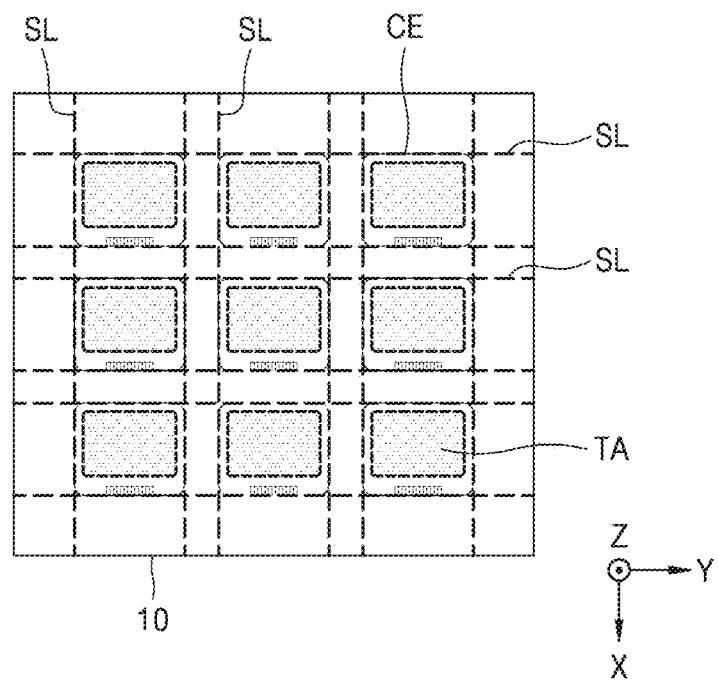
Figure 2E:
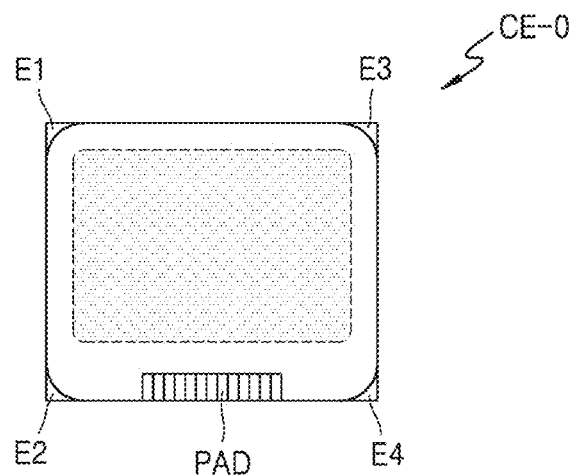
Figure 2F:
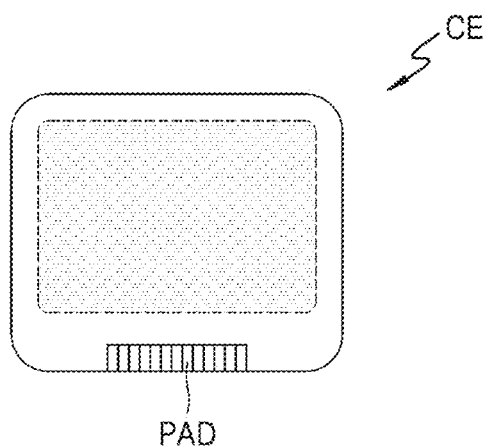
Figure 3:
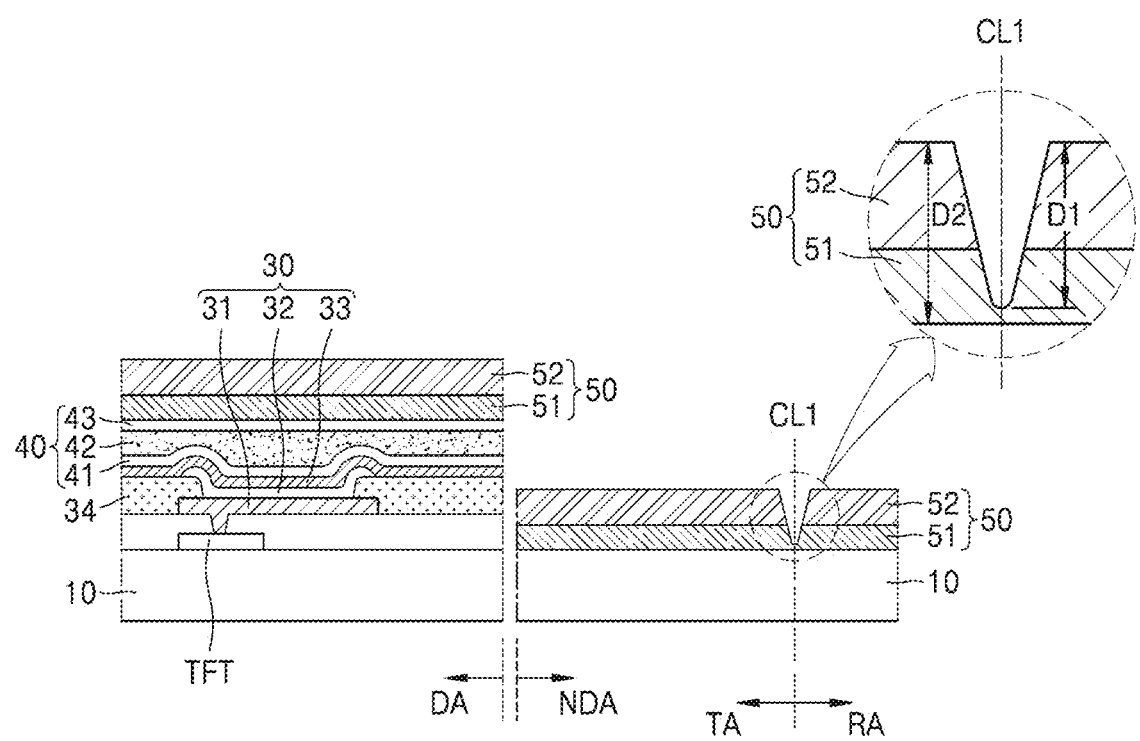
FIG. 3 is a schematic cross-sectional view of an area A of FIG. 2B.
Figure 4:
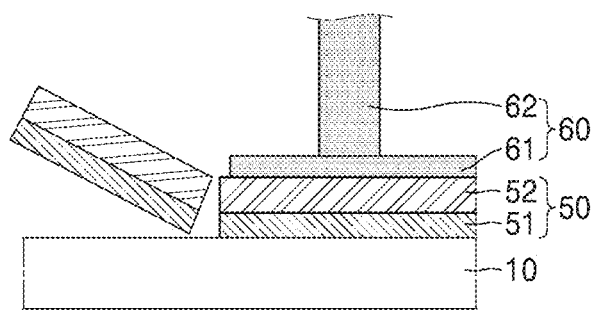
FIG. 4 is a schematic cross-sectional view of an area B of FIG. 2C.

FIG. 1 is a flowchart of a method of manufacturing an organic light-emitting display apparatus, according to a first exemplary embodiment. FIGS. 2A, 2B, 2C, 2D, 2E, and 2F are plan views illustrating a method of manufacturing an organic light-emitting display apparatus, according to the embodiment of FIG. 1. Particularly, FIG. 2A is a plan view illustrating a mother display panel 100 and a mother protective film 50 that are laminated on each other; FIG. 2B is a plan view illustrating the mother protective film 50 on which a cutting line CL1 and a first additional cutting line CL2 are formed; FIG. 2C is a plan view illustrating an operation in which a fixing member 60 is arranged on the mother protective film 50 within an area formed by the cutting line; FIG. 2D is a plan view illustrating a scribing operation; FIG. 2E is a plan view illustrating an operation of rounding corner portions of a display cell CE; and FIG. 2F is a plan view illustrating an operation of polishing edges of the display cell CE. FIG. 3 is a schematic cross-sectional view of an area A of FIG. 2B, and FIG. 4 is a schematic cross-sectional view of an area B of FIG. 2C. The mother protective film 50 refers to a protective film in a mother state.

Referring to FIG. 1, the method of manufacturing an organic light-emitting display apparatus according to the exemplary embodiments may include an operation (51) of laminating a mother protective film on a mother display panel including a plurality of display cells each including display area and a peripheral area in an outer portion of the display cells, an operation (S2) of forming, on the mother protective film, a cutting line having a closed loop shape corresponding to the display cells and an additional cutting line near the cutting line, an operation (S3) of placing a fixing member on the mother protective film within an area formed by the cutting line, an operation (S4) of physically peeling the additional cutting line to peel a dummy area except for a target area within the area formed by the cutting line, from the mother display panel, and an operation (S5) of removing the fixing member and scribing the mother display panel to separate the mother display panel into the plurality of display cells, and an operation (S6) of processing edges of the display cells.

Referring to FIG. 2A, the mother protective film 50 is laminated on the mother display panel 100.

The mother display panel 100 includes a plurality of display cells CE and a peripheral area PA located in an outer portion of the display cells CE.

A display cell CE is a minimum unit that may be individually separated after a scribing process and distributed as a display apparatus, and may include a display area DA (see FIG. 4) and a non-display area NDA (see FIG. 3) including a pad unit PAD.

The display area DA is an area displaying an image, and a plurality of pixels including an organic light-emitting device (30, see FIG. 3) may be arranged in the display area DA. Each pixel may include at least two thin-film transistors and at least one capacitor.

The non-display area NDA is an area where no image is displayed, and a circuit unit via which an electrical signal is applied to the display area DA, wiring, and a pad unit PAD or the like may be arranged in the non-display area NDA. The nine display cells CE illustrated in FIG. 2A are an example, and the mother display panel 100 may also include more display cells CE.

The peripheral area PA is an area that is removed after a scribing operation. A wiring or a pad used to inspect the performance of a display cell CE may be arranged in a portion of the peripheral area PA, and in another portion of the peripheral area PA, no functional layer may be formed, and only the mother substrate 10 may be arranged or some insulating layers may be further arranged on the mother substrate 10.

The mother substrate 10 may include a glass material. The mother substrate 10 formed of a glass material is more rigid than a substrate formed of a plastic material, and thus, a display cell CE may be formed on the mother substrate 10 formed of a glass material, without a supporting substrate, thus simplifying a process of attaching and detaching a supporting substrate.

The mother protective film 50 is attached on the display cell CE to protect the display cell CE. The mother protective film 50 may include an adhesive layer 51 (see FIG. 3) and a base film 52 (see FIG. 3).

The base film 52 may include a plastic film supporting the adhesive layer 51 and may include, for example, polyethylene terephthalate (PET).

The adhesive layer 51 may include an adhesive material. A dummy area RA (see FIG. 2B) of the mother protective film 50 except for a target area TA (see FIG. 2B) may be removed before a scribing operation, and the target area TA may be removed after completing the display cell CE.

Referring to FIG. 2B, a cutting line CL1 and a first additional cutting line CL2 are formed on the mother protective film 50.

The cutting line CL1 has a closed loop shape that is smaller than an area of the display cell CE, in an area corresponding to the display cell CE, and the first additional cutting line CL2 extends in a first direction X and connected between adjacent cutting lines CL1, and an end portion of each first additional cutting line CL2 may extend to each end portion of the mother protective film 50.

The mother protective film 50 includes the target area TA within an area formed by the cutting line CL1 having a closed loop shape and the dummy area RA outside the target area TA.

Referring to FIG. 3 illustrating the area A of FIG. 2B, the target area TA within an area formed by the cutting line CL1 may include the display area DA and a portion of the non-display area NDA.

A thin-film transistor TFT, a capacitor, and various wirings may be arranged on the mother substrate 10 of the display area DA. The organic light-emitting device 30 that is electrically connected to at least one thin-film transistor TFT may be arranged on the mother substrate 10.

The organic light-emitting device 30 may include a first electrode 31, an intermediate layer 32 including an organic emissive layer, and a second electrode 33.

The first electrode 31 and the second electrode 33 may include a reflective layer formed of Mg, Al, Pt, Pd, Au, Ni, Nd, Ir, Cr or a compound thereof, or a transparent conductive oxide layer on or under the reflective layer. Alternatively, the first electrode 31 and the second electrode 33 may include thin films including silver (Ag) or an Ag alloy or a transparent conductive oxide layer formed on the thin films. The first electrode 31 and the second electrode 33 may be formed as a reflective electrode or a transmissive electrode according to a type and thickness of a conductive material.

A pixel defining layer 34 covering an end portion of the first electrode 31 may prevent or suppress an electric field concentration at the end portion of the first electrode 31 and defines a light-emitting area.

The intermediate layer 32 may further include, in addition to an organic emissive layer, at least one of a hole injection layer, a hole transport layer, an electron transport layer, and an electron injection layer.

A thin-film encapsulation member 40 is arranged on the organic light-emitting device 30. The thin-film encapsulation member 40 may include a first inorganic layer 41, an organic layer 42, and a second inorganic layer 43. The organic layer 42 may include a polymer-based material such as polymethyl methacrylate (PMMA), polycarbonate (PC), polystyrene (PS), an acrylic resin, an epoxy resin, polyimide or polyethylene. The first inorganic layer 41 and the second inorganic layer 43 may include aluminum nitride (AlN), aluminum oxide ($Al_2O_3$), titanium nitride (TiN), titanium oxide ($TiO_2$), silicon oxynitride (SiON), silicon nitride (SiNx), silicon oxide (SiOx), or the like.

In the display area DA, the mother protective film 50 including the adhesive layer 51 and the base film 52 is arranged on the thin-film encapsulation member 40. The mother protective film 50 is attached over an area of the non-display area NDA up to the dummy area RA, which is outside the target area TA, as a single unit.

While the mother protective film 50 attached on the thin-film encapsulation member 40 is illustrated in FIG. 3, a touch sensing layer may be further arranged on the thin-film encapsulation member 40, and the mother protective film 50 may be attached on the touch sensing layer.

According to another embodiment, instead of a structure where the thin-film encapsulation member 40 and a touch sensing layer are independent of each other, a touch sensing layer may be formed between thin films of the thin-film encapsulation member 40, and the mother protective film 50 may be attached to an outermost thin film of the thin-film encapsulation member 40.

According to another embodiment, a polarization film may be further included on the thin-film encapsulation member 40, and the mother protective film 50 may be attached on the polarization film.

According to another embodiment, the mother protective film 50 may be attached on the thin-film encapsulation member 40 on which both a touch sensing layer and a polarization film are included.

That is, after forming all components needed for each display cell CE before a scribing operation, the mother protective film 50 is attached to the mother display panel 100.

While FIG. 3 illustrates the mother protective film 50 attached directly on the mother substrate 10 in the non-display area NDA, the present disclosure is not limited thereto. Some insulating layers may be further arranged between the mother substrate 10 and the mother protective film 50.

In the mother protective film 50 described above, the cutting line CL1 and the first additional cutting line CL2 may be formed using a laser beam. For example, a laser beam may be a $CO_2$ laser or an yttrium aluminum garnet (YAG) laser. As in the present embodiment, when the mother protective film 50 includes a non-metallic organic compound material, a $CO_2$ laser may be used.

Here, by adjusting a laser beam intensity and/or a laser irradiation time, the mother protective film 50 is cut such that a beam does not reach the mother substrate 10 (this may be hereinafter referred to as half cutting). In detail, a cutting depth D1 of the cutting line CL1 and the first additional cutting line CL2 is set to be less than a total thickness D2 of the mother protective film 50 such that the base film 52 of the mother protective film 50 is completely cut, but the adhesive layer 51 is cut only partially in a thickness direction.

When the base film 52 is not completely cut, it is difficult to peel the mother protective film 50, and thus, cutting is performed at least up to a thickness of the base film 52. However, as an intensity of an emitted laser beam has a process distribution in a certain range, when a laser beam intensity is too large, a cutting depth may exceed a depth of the adhesive layer 51 and may be greater than the thickness D2) of the mother protective film 50. In this case, the mother substrate 10 may be damaged, or when some insulating layers are on the mother substrate 10, the insulating layers may be damaged, and the organic light-emitting device 30 may deteriorate. Thus, cutting may be performed by adjusting an intensity and/or an irradiation time of a laser beam such that the adhesive layer 51 is cut only partially in a thickness direction.

According to another embodiment, the cutting line CL1 and the first additional cutting line CL2 may be formed using an ultrasound cutter. An ultrasound cutter resonates a vibrator and a blade by using a force generated in a piezoelectric element to generate a micro-vibration of about 20 kHz to about 40 kHz over a width of about 10 to about 70 micrometer (μm) in a third direction Z, thereby cutting the mother protective film 50. In this case, also, half cutting is performed on the mother protective film 50 such that the adhesive layer 51 is partially left so that an ultrasound wave does not reach the mother substrate 10, by adjusting an amplitude and/or vibration of the ultrasound cutter.

Cutting performed using a laser beam requires a device that collects gas byproducts of the base film 52 and the adhesive layer 51 generated due to heat and discharges the gas byproducts, whereas no such byproducts are generated when an ultrasound cutter is used.

According to another embodiment, the cutting line CL1 and the first additional cutting line CL2 may be formed on the mother protective film 50 by using a typical cutter such as a knife. In this case, also, half cutting may be performed on the mother protective film 50 such that the adhesive layer 51 is partially left so that a blade does not reach the mother substrate 10, by adjusting a cutting depth of the knife.

Referring to FIG. 2C, after arranging the fixing member 60 on the mother protective film 50 within an area formed by the cutting line CL1, a peeling operation is performed. That is, after fixing the target area TA by arranging the fixing member 60 on the target area TA of the mother protective film 50, a force F is applied to the first additional cutting line CL2 in a first direction X, thereby peeling the dummy area RA along the cutting line CL1, except for the target area TA.

Referring to FIG. 4 illustrating the area B of FIG. 2C, the fixing member 60 may include a fixing plate 61 completely covering the target area TA of the mother protective film 50 and a supporting portion 62 providing a vertical pressing force to the fixing plate 61 and connected to a controller that adjusts a height and a pressing force of the fixing plate 61.

Figure 5:
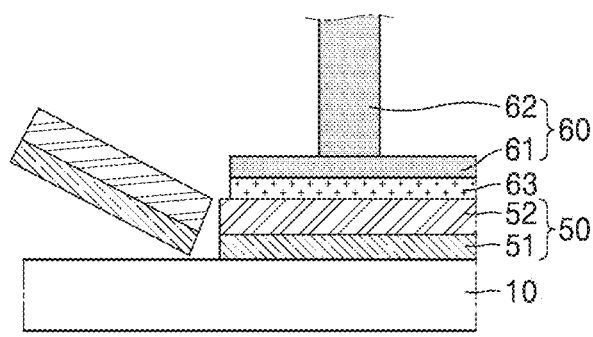
FIG. 5 is a schematic cross-sectional view of a state in which a buffer member is arranged between a fixing member and a mother protective film.

Referring to FIG. 5, a buffer member 63 may be further arranged between the fixing plate 61 and the mother protective film 50 to minimize defects occurring as the mother protective film 50 is stamped by the pressing pressure of the fixing plate 61. The buffer member 63 may be formed using various elastic materials.

As illustrated in FIG. 2C, while fixing the target area TA of the mother protective film 50 by using the fixing member 60, when a force F is applied in the first direction X, the first additional cutting line CL2 that is relatively close to the force F is peeled first, and then the cutting line CL1 formed along the target area TA is also peeled via the force F that is continuously applied. The cutting line CL1 and the first additional cutting line CL2 are half-cut, and thus, the adhesive layer 51 may be torn in a portion where the adhesive layer 51 is not completely cut.

While a direction of the force F is illustrated two-dimensionally on a XY plane, the force F may be applied as three-dimensional vector. For example, the force F may have a component in a third direction Z. When just a force F is applied after forming only the cutting line CL1 and the first additional cutting line CL2, without installing the fixing member 60, portions that are not parallel to the first direction X which is a component on a plane of the force F, but cross the first direction X, that is, portions of the cutting line CL1 extending in a second direction Y, are partially left, and accordingly, the target area TA near the cutting line CL1 may be lifted during a peeling operation. However, according to the present embodiment, before applying a force F, the fixing member 60 is arranged on the target area TA near the cutting line CL1 in the direction Y crossing the force F on a plane and a downward pressure is applied to the mother protective film 50, and thus, the dummy area RA may be neatly peeled without lifting the target area TA.

Meanwhile, while FIG. 2C illustrates an operation of peeling the dummy area RA at a time by simultaneously applying a plurality of forces F to the dummy area RA, the present disclosure is not limited thereto. That is, the force F may be applied to each dummy area RA multiple times.

Referring to FIG. 2D, after the dummy area RA of the mother protective film 50 is peeled as a result of the operation of FIG. 2C, while the target area TA is left, the mother substrate 10 is scribed.

A scribing line SL is formed along edges of the plurality of display cells CE in the first direction X and the second direction Y.

A scribing operation may be performed using a laser beam or a wheel cutting device. A laser beam may be a $CO_2$ laser or an yttrium aluminum garnet (YAG) laser. Alternatively, a scribing line SL may be formed by applying a force from the mother protective film 50 towards the mother substrate 10 by using a wheel cutting device. That is, the process may be simplified by performing a scribing operation on an upper surface of the mother substrate 10 without reversing the mother substrate 10.

Referring to FIG. 2E, an operation of rounding corner portions E1, E2, E3, and E4 of a display cell CE-0 that is separated as a result of the scribing operation is illustrated. By rounding the corner portions E1, E2, E3, and E4, apparatus strength may be reinforced.

Referring to FIG. 2F, an operation of polishing edges of a display cell CE is illustrated. As the edges of the display cell CE scribed using a wheel cutting device has a rough surface, a defect may be caused in a subsequent module process. Thus, by polishing the edges of the display cell CE, a defect rate of the display cell CE may be reduced.

After the operation illustrated in FIG. 2F, a cleaning operation may be additionally performed, and when a subsequent operation such as combining an external connection terminal to a pad unit PAD while a protective film is attached to the target area TA, is completed, the protective film attached to the target area TA may be finally removed. Alternatively, when the protective film attached to the target area TA may not be removed but left when the protective film is a functional film or according to other necessity.

As described above, according to the method of peeling a mother protective film and a method of manufacturing an organic light-emitting display apparatus, according to the present disclosure, as a mother protective film is peeled after fixing the target area TA by pressing the target area TA by using the fixing member 60, lifting the target area TA of the mother protective film 50 due to portions of an adhesive layer remaining due to half cutting may be prevented or suppressed. In addition, a protective film is not attached to each of individual display cells, but a protective film in a mother state is used and attached, and thus, the process may be simplified. In addition, even when a protective film is attached to a mother display panel of a combination of a glass substrate and a thin film encapsulation member, a scribing operation may be performed just by using a wheel cutting device, and thus, the process may be simplified.

A method of manufacturing an organic light-emitting display apparatus, according to a comparative example, will be described with reference to FIGS. 6A, 6B, 6C, 6D, 6E, 6F, and 6G. The method of FIGS. 6A, 6B, 6C, 6D, 6E, 6F, and 6G will be described by focusing on the difference from the method of manufacturing an organic light-emitting display apparatus according to the first exemplary embodiment.

Figure 6A:
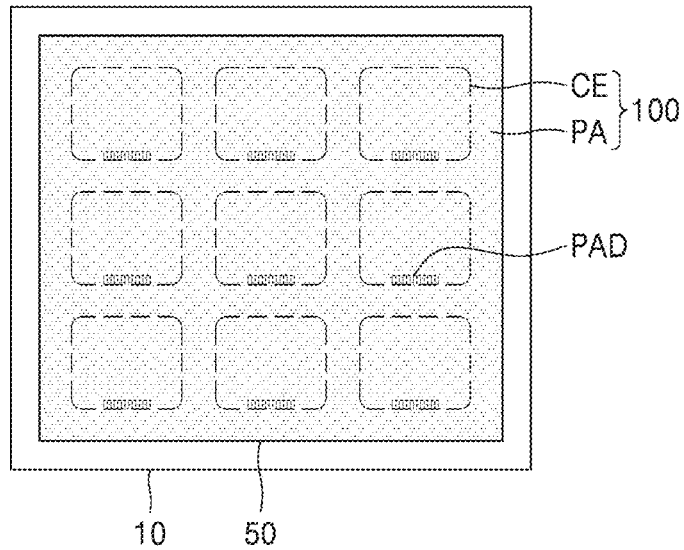
FIGS. 6A, 6B, 6C, 6D, 6E, 6F, and 6G are schematic plan views illustrating a method of manufacturing an organic light-emitting display apparatus, according to a comparative example.

Referring to FIG. 6A, a mother protective film 50 is laminated on a mother display panel 100.

The mother display panel 100 includes a plurality of display cells CE and a peripheral area PA located in an outer portion of the display cells CE, and a mother substrate 10 may include a glass material. The mother protective film 50 is attached to an upper portion of the display cells CE to protect the display cells CE.

Figure 6B:
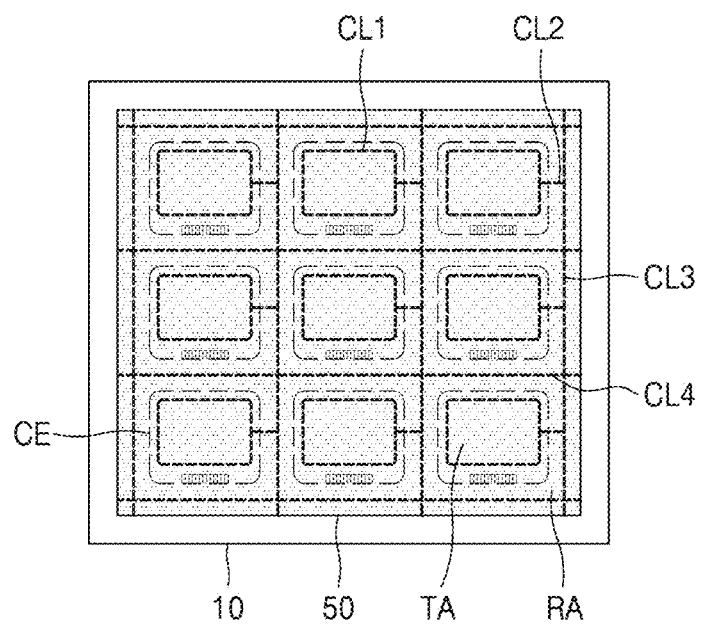

Referring to FIG. 6B, a cutting line CL1, a first additional cutting line CL2, a second additional cutting line CL3, and a third additional cutting line CL4 are formed on the mother protective film 50.

The cutting line CL1 has a closed loop shape that is smaller than an area of each display cell CE in an area corresponding to each display cell CE as in the first exemplary embodiment described above.

The first additional cutting line CL2 extends in the second direction Y, but is not connected between adjacent cutting lines CL1, and an end of the first additional cutting line CL2 is connected to the second additional cutting line CL3. The second additional cutting line CL3 and the third additional cutting line CL4 surround each display cell CE and are cut in a lattice shape.

The cutting line CL1 and the first through third additional cutting lines CL2, CL3, and CL4 may be formed using a $CO_2$ laser beam. Here, by adjusting a laser beam intensity and/or a laser irradiation time, the mother protective film 50 is cut such that a beam does not reach the mother substrate 10.

Figure 6C:
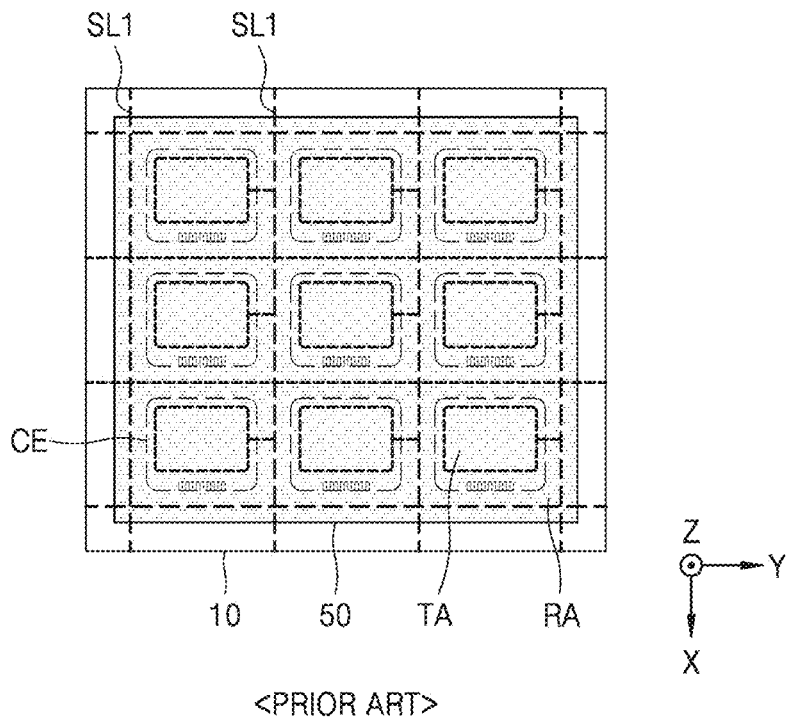

Referring to FIG. 6C, while having the mother protective film 50 totally attached, a first scribing operation is performed on the mother substrate 10.

Meanwhile, before the first scribing operation, an operation of etching the mother substrate 10 to a smaller thickness may be further performed. Here, an acid resistant film may be further attached on the mother protective film 50.

A plurality of scribing lines SL1 are formed along edges of the plurality of display cells CE in a first direction X and a second direction Y. In the first scribing operation, a laser beam may be used. In addition, a wheel cutting device may be used in the first scribing operation.

The mother protective film 50 of the dummy area RA is not removed in the comparative example, and thus, no force may be applied from the mother protective film 50 toward the mother substrate 10. That is, after having flipped over the mother substrate 10, the first scribing operation is performed on a lower surface of the mother substrate 10. Unlike the first exemplary embodiment described above, an operation of reversing the mother substrate 10 is additionally performed.

After the first scribing operation, the mother display panel 100 is separated into a plurality of units each including a display cell CE-1.

Figure 6D:
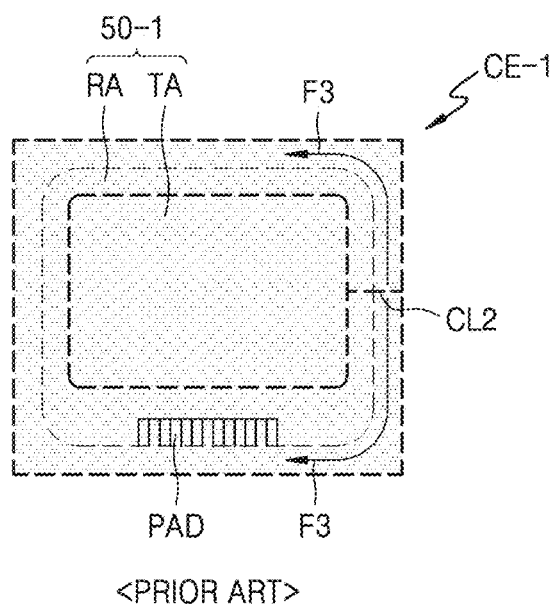

Referring to FIG. 6D, an operation of peeling a dummy area RA of a mother protective film 50-1 that is separated from the display cell CE-1 as a result of the first scribing operation is illustrated.

By applying a force F3 in two directions with respect to the first additional cutting line CL2, the dummy area RA of the mother protective film 50-1 is peeled. As the peeling operation is performed with the display cell CE-1 in a separated state, a peeling operation is to be repeated by the number of times as the number of display cells CE-1. In addition, by reversing the separated display cell CE-1 upside down again, a peeling operation is performed on an upper surface of the mother protective film 50-1.

Figure 6E:
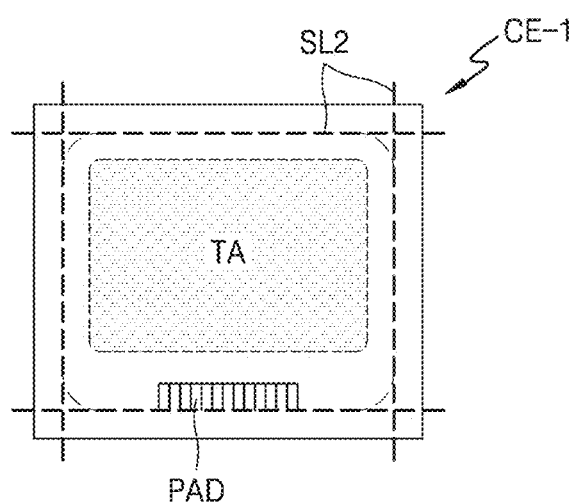

Referring to FIG. 6E, after peeling the dummy area RA and attaching the target area TA, a second scribing operation in which a second scribing line SL2 is formed to remove edges of the display cell CE-1 is performed.

Figure 6F:
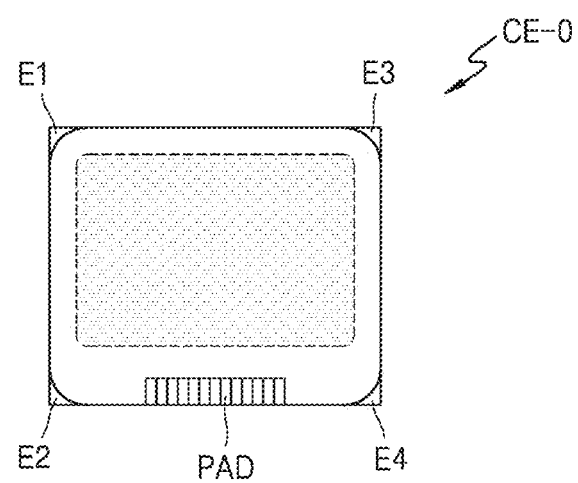

Referring to FIG. 6F, corner portions E1, E2, E3, and E4 of a display cell CE-0 that is separated as a result of the second scribing operation are rounded, thereby forming the display cell CE-0 having rounded corner portions.

Figure 6G:
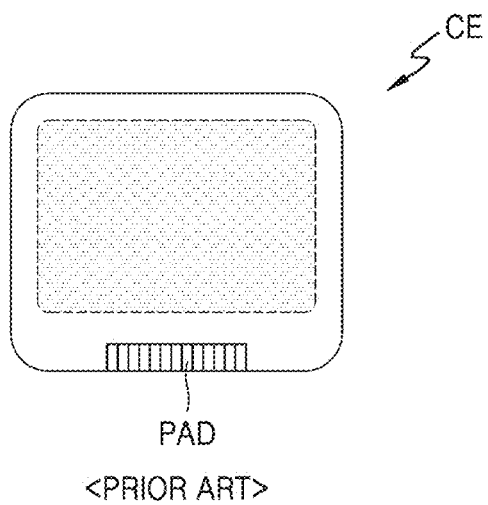

Referring to FIG. 6G, the display cell CE is formed by polishing edges of the display cell CE-0 of FIG. 6F.

Unlike the comparative example, in the present exemplary embodiments, instead of removing a dummy area of a protective film for each individual display cell, a dummy area may be removed at a time in a mother state, thus increasing process efficiency. In addition, the number of times a mother substrate is flipped upside down may be reduced, and thus the process efficiency may be increased.

A method of manufacturing an organic light-emitting display apparatus, according to a second exemplary embodiment, will be described with reference to FIG. 7.

Figure 7:
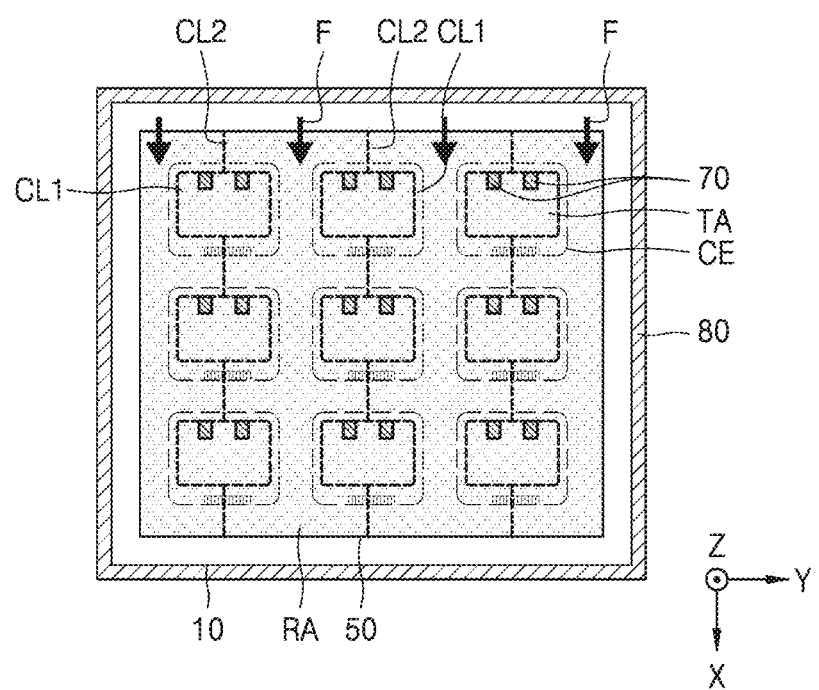
FIG. 7 is a schematic plan view illustrating a method of manufacturing an organic light-emitting display apparatus, according to a second exemplary embodiment.

Referring to FIG. 7, a mother protective film 50 is laminated on a mother substrate 10 on which a plurality of display cells CE are formed. A cutting line CL1 and a first additional cutting line CL2 are formed on the mother protective film 50, thereby distinguishing the target area TA and the dummy area RA from each other.

Unlike the first exemplary embodiment illustrated in FIGS. 2A, 2B, 2C, 2D, 2E, and 2F, in which the fixing member 60 (see FIG. 2C) approximately covers the entire area of the target area TA, in the second exemplary embodiment, a magnet 70 formed of a magnetic material is included as a fixing member and arranged only in a portion of the target area TA. Instead, a table 80 having magnetic properties is arranged on a lower surface of the mother substrate 10.

The table 80 having magnetic properties is not necessarily a magnet. When the magnet 70 used as a fixing member is a permanent magnet, the table 80 may be a paramagnetic material that exhibits magnetic properties only in the presence of a magnetic field. Alternatively, when the table 80 is a permanent magnet, the magnet 70 used as a fixing member may be a paramagnetic material that temporarily has magnetic properties.

After arranging the magnet 70 and the table 80 having magnetic properties respectively on and under the target area TA and maintaining an adhesive force between the mother protective film 50 and the mother substrate 10 via a magnetic force, a force F is applied to peel the dummy area RA of the mother protective film 50.

As described above, in the present embodiment, unlike the previous embodiment in which the fixing member 60 is covered over the entire target area TA, the magnet 70 is arranged only partially, and thus, defects caused as a display area is stamped by a load of the fixing member 60 may be prevented or suppressed.

Figure 8A:
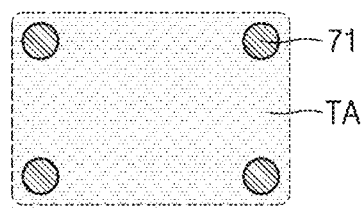
FIGS. 8A and 8B are plan views illustrating various modification examples of a magnet member.
Figure 8B:
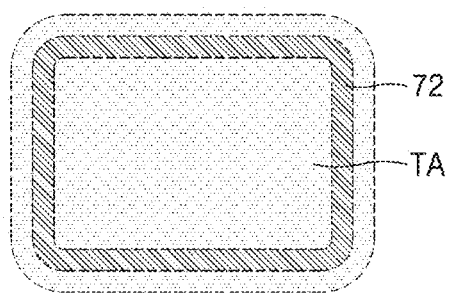

Meanwhile, a magnet used in the present embodiment may be a point magnet 71 arranged in a point shape in a corner portion inside the target area TA as illustrated in FIG. 8A or may be a magnet 72 arranged as a closed loop along edges of a display cell inside the target area TA.

Hereinafter, various examples of a cutting line and an additional cutting line formed on the mother protective film 50 of the present embodiment will be described with reference to FIGS. 9 and 10.

Figure 9:
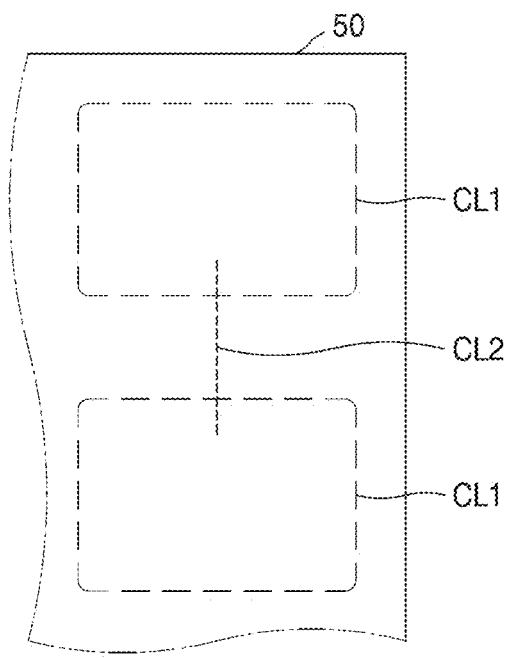
FIGS. 9 and 10 are plan views illustrating modified examples of a cutting line and a first additional cutting line.

Referring to FIG. 9, both ends of the first additional cutting line CL2 connected between cutting lines CL1 are formed inside the cutting lines CL1. That is, by overlapping the cutting line CL1 and the first additional cutting line CL2, the peeling operation may be easily performed.

Figure 10:
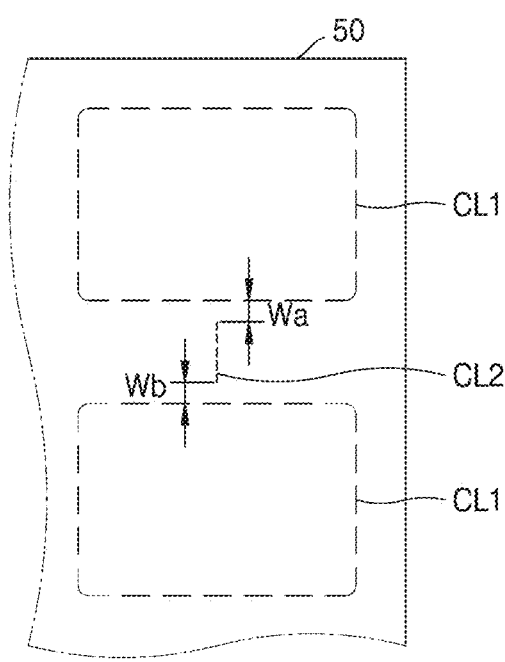

Referring to FIG. 10, the first additional cutting line CL2 may be spaced apart from the cutting line CL1. A first end of the first additional cutting line CL2 may be spaced apart from the cutting line CL1 by a first width $w_a$, and a second end of the first additional cutting line CL2 may be spaced apart from the cutting line CL1 by a second width $w_b$. Along the first width $w_a$ and the second width $w_b$, a portion of the adhesive layer 51 (see FIG. 3) may remain. However, in this case, also, due to a pressure applied via the fixing member 60 (see FIG. 2C) on the target area TA, peeling may be performed neatly, without lifting the target area TA of the mother protective film 50.

Hereinafter, a method of manufacturing an organic light-emitting display apparatus, according to a third exemplary embodiment, will be described with reference to FIGS. 11A, 11B, and 11C. The method of FIGS. 11A, 11B, and 11C will be described by focusing on the difference of the third exemplary embodiment from the first exemplary embodiment illustrated in FIGS. 2A, 2B, 2C, 2D, 2E, and 2F.

Figure 11A:
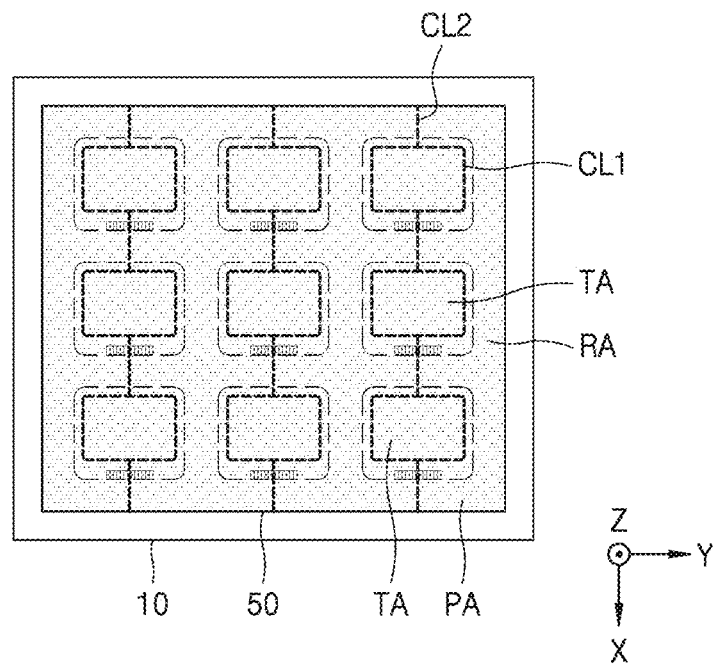
FIGS. 11A, 11B, and 11C are schematic plan views illustrating a method of manufacturing an organic light-emitting display apparatus, according to the third exemplary embodiment.

The third exemplary embodiment illustrated in FIG. 11A is substantially identical to the first exemplary embodiment illustrated in FIG. 2B. That is, after laminating the mother display panel 100 (see FIG. 2B) and the mother protective film 50, a cutting line CL1 and a first additional cutting line CL2 are formed in the mother protective film 50. Here, the adhesive layer 51 (see FIG. 3) of the mother protective film 50 has relatively high adhesive force.

Figure 11B:
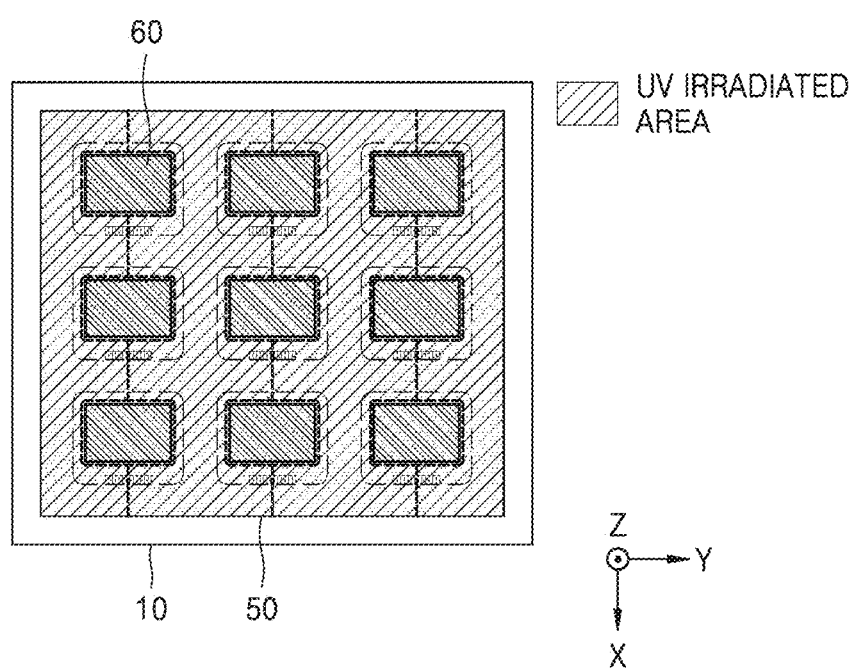

Referring to FIG. 11B, after arranging the fixing member 60 on the mother protective film 50 within an area formed by the cutting line CL1, areas except the target area TA of the mother protective film 50, that is, the dummy area RA, are irradiated with ultraviolet (UV) ray to reduce the adhesive force of the adhesive layer 51 of the mother protective film 50.

Here, UV irradiation may be performed by arranging a mask having an opening corresponding to the target area TA, on the mother protective film 50, or a mask may be omitted and the fixing member 60 may function as a mask.

Figure 11C:
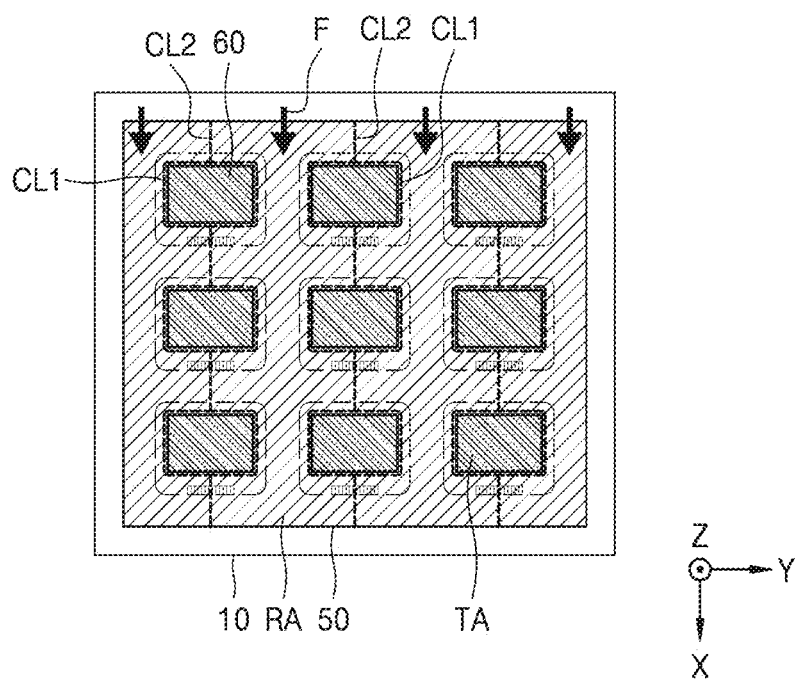

Referring to FIG. 11C, while the target area TA of the mother protective film 50 is being fixed using the fixing member 60, a force F is applied to the first additional cutting line CL2 in a first direction X, thereby peeling the dummy area RA along the cutting line CL1, except the target area TA. The embodiment of FIG. 11C is different from FIG. 2C in that UV is also irradiated to the dummy area RA of the mother protective film 50.

By using the mother protective film 50 but irradiating only the dummy area RA with UV, an adhesive force of the dummy area RA may be reduced, thereby facilitating the peeling operation. In addition, in the target area TA, an adhesive force of the mother protective film 50 is strong, and thus, the present embodiment may be applied to an operation requiring a strong adhesive force, for example, when attaching the mother protective film 50 on a polarization film.

Hereinafter, a method of manufacturing an organic light-emitting display apparatus, according to a fourth embodiment will be described with reference to FIGS. 12A, 12B, and 12C. The method of FIGS. 12A, 12B, and 12C will be described by focusing on the difference from the third exemplary embodiment illustrated in FIGS. 11A, 11B, and 11C.

Figure 12A:
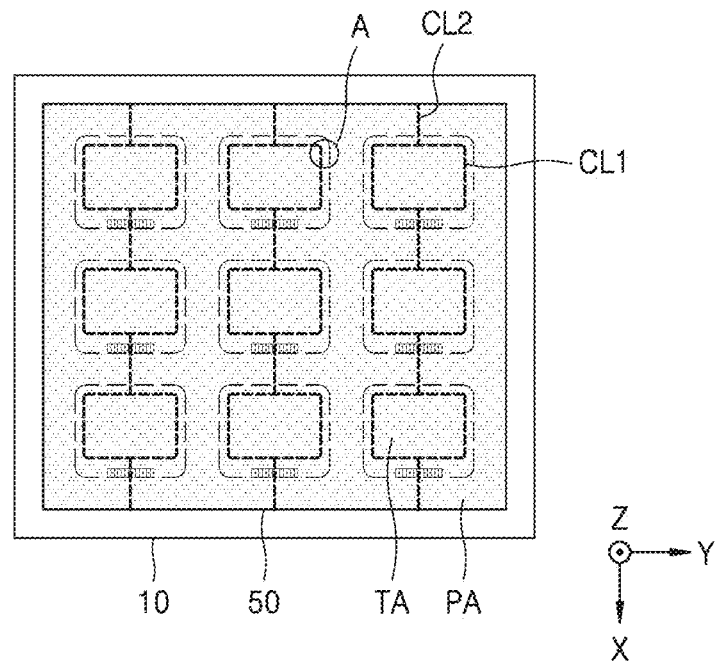
FIGS. 12A, 12B, and 12C are schematic plan views illustrating a method of manufacturing an organic light-emitting display apparatus, according to the fourth exemplary embodiment.

FIG. 12A is identical to FIG. 11A except for an adhesive force of the mother protective film 50. That is, after laminating a mother display panel 100 (see FIG. 2B) and a mother protective film 50, a cutting line CL1 and a first additional cutting line CL2 are formed in the mother protective film 50. Here, an adhesive layer 51 (see FIG. 3) that has a relatively small adhesive force is used as the mother protective film 50.

Figure 12B:
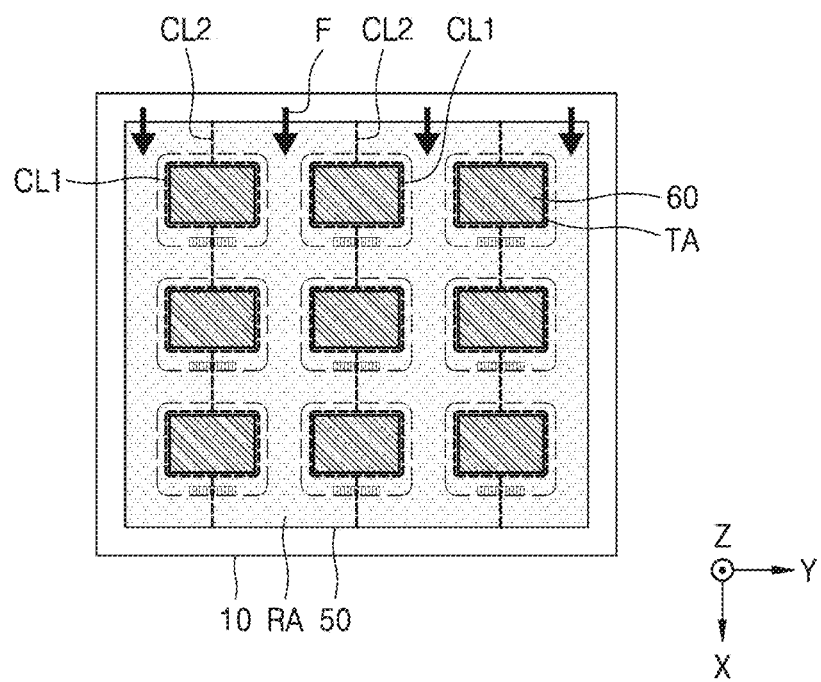

Referring to FIG. 12B, while the target area TA of the mother protective film 50 is being fixed using the fixing member 60, a force F is applied to the first additional cutting line CL2 in a first direction X, thereby peeling the dummy area RA along the cutting line CL1, except the target area TA.

Figure 12C:
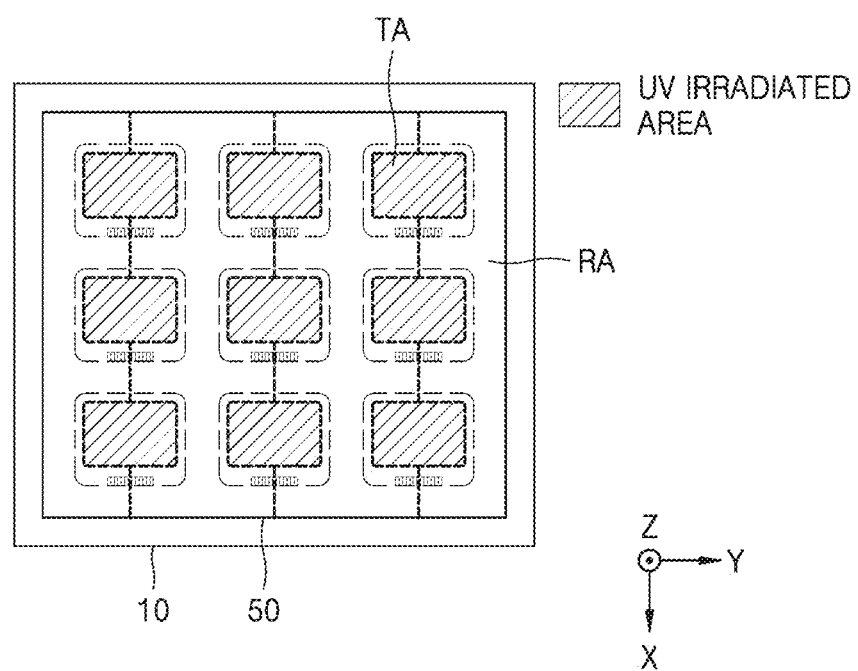

Referring to FIG. 12C, after the dummy area RA of the mother protective film 50 is removed and while the target area TA is left, by using a mask, only the target area TA of the mother protective film 50 is irradiated with UV, thereby reinforcing the adhesive force of the adhesive layer 51.

The UV irradiation may be performed by arranging a mask having an opening corresponding to the target area TA, on the mother protective film 50.

Compared to the third exemplary embodiment, when using an adhesive layer having a relatively small adhesive force, the fourth exemplary embodiment is different in that the adhesive force of the adhesive layer is reinforced by irradiating UV to a target area after a peeling operation. However, also in the fourth exemplary embodiment, an adhesive force of the mother protective film 50 is strong in the target area TA, and thus, the present embodiment may be applied to an operation requiring a strong adhesive force, for example, when attaching the mother protective film 50 on a polarization film.

According to the fourth exemplary embodiment, the mother protective film 50 is peeled while fixing the target area TA by using the fixing member 60, and thus, lifting of the target area TA of the mother protective film 50 due to the adhesive layer left by half cutting may be prevented or suppressed.

In addition, a protective film is not individually attached to each of the display cells CE, but a protective film in a mother state is used to attach the protective film, and thus, the process may be simplified.

In addition, even when a protective film is attached to a mother display panel including a combination of a glass substrate and a thin film encapsulation member, a scribing operation may be performed just using a wheel cutting device, and thus, the process may be simplified.

In addition, the operation may be simplified by performing a scribing operation on an upper surface of the mother substrate 10, without reversing the mother substrate 10.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A method of peeling a mother protective film from a mother display panel, the method comprising:
    laminating the mother protective film on the mother display panel, the mother display panel comprising a plurality of display cells each comprising a display area and a peripheral area in an outer portion of the display cells;
    forming a target area and a dummy area on the mother protective film by forming a cutting line having a closed loop shape enclosing the target area corresponding to the display cells and an additional cutting line in a first direction in close proximity to the cutting line;
    arranging a fixing member on the mother protective film within the target area enclosed by the cutting line; and
    physically peeling off the mother protective film from the mother display panel located at the dummy area.

2. The method of claim 1, wherein a depth of the cutting line and the additional cutting line are less than a thickness of the mother protective film.

3. The method of claim 1, wherein the cutting line and the additional cutting line are formed using a laser beam.

4. The method of claim 3, wherein the laser beam comprises a $CO_2$ laser.

5. The method of claim 1, wherein the cutting line and the additional cutting line are formed using a knife.

6. The method of claim 1, wherein the cutting line and the additional cutting line are formed using an ultrasound cutter including a vibrator and a blade.

7. The method of claim 1, wherein the fixing member comprises a fixing plate and a supporting portion vertically connected to the fixing plate.

8. The method of claim 7, wherein a buffer member is further arranged between the fixing plate and the mother protective film.

9. The method of claim 1, wherein the fixing member comprises a magnetic material.

10. The method of claim 9, wherein the arranging the fixing member comprises arranging a table having magnetic properties on a lower surface of the mother display panel.

11. The method of claim 9, wherein the fixing member is arranged in a point shape within the target area.

12. The method of claim 9, wherein the fixing member is arranged in a closed loop shape within the target area.

13. The method of claim 1, wherein the physically peeling off of the dummy area comprises applying an external force along the additional cutting line in the first direction.

14. The method of claim 1, wherein the additional cutting line is connected to the cutting line.

15. The method of claim 14, wherein at least an end of the additional cutting line is formed within the cutting line.

16. The method of claim 1, wherein the additional cutting line is spaced apart from the cutting line.

17. The method of claim 1, wherein the target area having a closed loop shape has a smaller area than the display cell.

18. The method of claim 1, wherein the mother protective film comprises an adhesive layer attached to the mother display panel and a base substrate arranged on the adhesive layer.

19. The method of claim 18 further comprising: before the physically peeling off of the dummy area and after the arranging of the fixing member, irradiating the dummy area with ultra violet (UV) light to reduce an adhesive force of a portion of the adhesive layer corresponding to the dummy area.

20. The method of claim 18 further comprising, after the physically peeling off of the dummy area:
    removing the fixing member from the target area; and
    irradiating the target area with UV light to increase an adhesive force of a portion of the adhesive layer corresponding to the target area.

21. The method of claim 20, the irradiating of the target area comprises:
    arranging a mask having an opening corresponding to the target area on the mother protective film; and
    irradiating the target area with the UV light.

22. A method of manufacturing an organic light-emitting display apparatus, the method comprising:
    forming a mother display panel on a mother substrate, the mother display panel comprising:
        display cells comprising: a plurality of organic light-emitting devices; and an encapsulation member encapsulating the plurality of organic light-emitting devices; and
        a peripheral area arranged on an outer portion of the display cells;
    laminating a mother protective film on the mother display panel;
    forming a target area and a dummy area on the mother protective film by forming a cutting line having a closed loop shape enclosing the target area corresponding to the display cell and an additional cutting line in a first direction in close proximity to the cutting line;
    arranging a fixing member on the mother protective film within the target area enclosed by the cutting line;
    physically peeling off the mother protective film from the mother display panel located at the dummy area;
    removing the fixing member, and then separating the mother display panel into a plurality of display cells by scribing the mother display panel; and
    processing edges of the plurality of display cells.

23. The method of claim 22, wherein the mother substrate is scribed using a wheel cutting device.

24. The method of claim 23, wherein the mother substrate is scribed by applying a force to the wheel cutting device in a direction from the mother protective film to the mother substrate.

25. The method of claim 22, wherein the processing of edges of the display cell comprises rounding at least one corner portion of the display cell.

26. The method of claim 22, wherein the processing of edges of the display cell comprises polishing the edges of the display cell.

27. The method of claim 22, wherein the encapsulation member comprises at least one organic layer and at least one inorganic layer.

28. The method of claim 22, further comprising, before laminating the mother protective film, forming a touch layer on the encapsulation member.

29. The method of claim 22, wherein the mother protective film further comprises a polarization function.

* * * * *